United States Patent
Schaffstein et al.

(10) Patent No.: US 7,180,823 B1
(45) Date of Patent: Feb. 20, 2007

(54) FLEXIBLE SDRAM CLOCKING (MS-DLL)

(75) Inventors: Michael J. Schaffstein, Waltham, MA (US); Brendan P. Mullaly, Nashua, NH (US)

(73) Assignee: Sigmatel, Inc., Austin, TX (US)

( * ) Notice: Subject to any disclaimer, the term of this patent is extended or adjusted under 35 U.S.C. 154(b) by 3 days.

(21) Appl. No.: 11/032,604

(22) Filed: Jan. 10, 2005

Related U.S. Application Data

(60) Provisional application No. 60/535,401, filed on Jan. 9, 2004.

(51) Int. Cl.
*G11C 8/00* (2006.01)
(52) U.S. Cl. ............................. 365/233; 365/194
(58) Field of Classification Search ............... 365/194, 365/233
See application file for complete search history.

(56) References Cited

U.S. PATENT DOCUMENTS

| | | | |
|---|---|---|---|
| 6,492,852 B2 * | 12/2002 | Fiscus | 327/158 |
| 6,664,830 B2 * | 12/2003 | Miller | 327/158 |
| 6,895,522 B2 * | 5/2005 | Johnson et al. | 713/401 |
| 2002/0130691 A1 * | 9/2002 | Silvestri | 327/158 |
| 2004/0008714 A1 * | 1/2004 | Jones | 370/428 |
| 2005/0138457 A1 * | 6/2005 | Gomm et al. | 713/401 |

* cited by examiner

*Primary Examiner*—Michael Tran
(74) *Attorney, Agent, or Firm*—Toler Schaffer, LLP

(57) ABSTRACT

A delay lock loop for use in meeting SDRAM timing requirements, wherein a timing relationship between data generated by a computer chip and a clock in said DRAM is fully programmable, and wherein said delay lock loop is digitally implemented. The delay lock loop includes a first delay chain to measure a number of delay taps in a single clock cycle of the clock of the SDRAM and a second delay chain to delay the clock of the SDRAM. The second delay chain is matched to the first delay chain.

13 Claims, 1 Drawing Sheet

FLEXIBLE SDRAM CLOCKING (MS-DLL)

REFERENCE TO PENDING PRIOR PATENT APPLICATION

This patent application claims benefit of pending prior U.S. Provisional Patent Application Serial No. 60/535,401, filed Jan. 9, 2004 by Michael J. Schaffstein et al. for FLEXIBLE SDRAM CLOCKING (MS-DLL).

The above-identified patent application is hereby incorporated herein by reference.

FIELD OF THE INVENTION

This invention relates to office automation products in general, and more particularly to printers, fax machines, scanners, copiers and the like. Even more particularly, this invention relates to the integration of formerly separate functions into single devices such as those sometimes referred to as MFPs (Multi-Functional-Peripherals), and the integration of multiple functions into a single ASIC (Application-Specific Integrated Circuit) such as those produced by Oasis Semiconductor, Inc. of Waltham, Mass.

BACKGROUND

A challenge to designing an interface to synchronous DRAM (SDRAM) is managing the timing requirements of the SDRAM over the full range of operating conditions of the driving circuit. When implemented in an ASIC, the driving circuit's timing will vary with temperature, voltage and fabrication process variation. A design that attempts to meet SDRAM's timing requirements at one extreme of the ASIC's operating conditions may not meet the timing at the other extreme of the conditions. A method is needed to create timing that is largely independent of these conditions.

The timing of an SDRAM requires that data signals be stable within a window of time before and after the rising edge of the SDRAM's clock. The stable time before the clock's rising edge is called the setup time; the stable time after the clock's rising edge is called the hold time. Inside an ASIC, the circuits that generate data use a clock's rising edge as a timing reference. Thus data signals have a timing relationship to the clock. As the ASIC's operating conditions change, that timing relationship also changes. This presents a problem when attempting to match the SDRAM's timing requirements, which are fixed.

DETAILED DESCRIPTION

Figure 1:
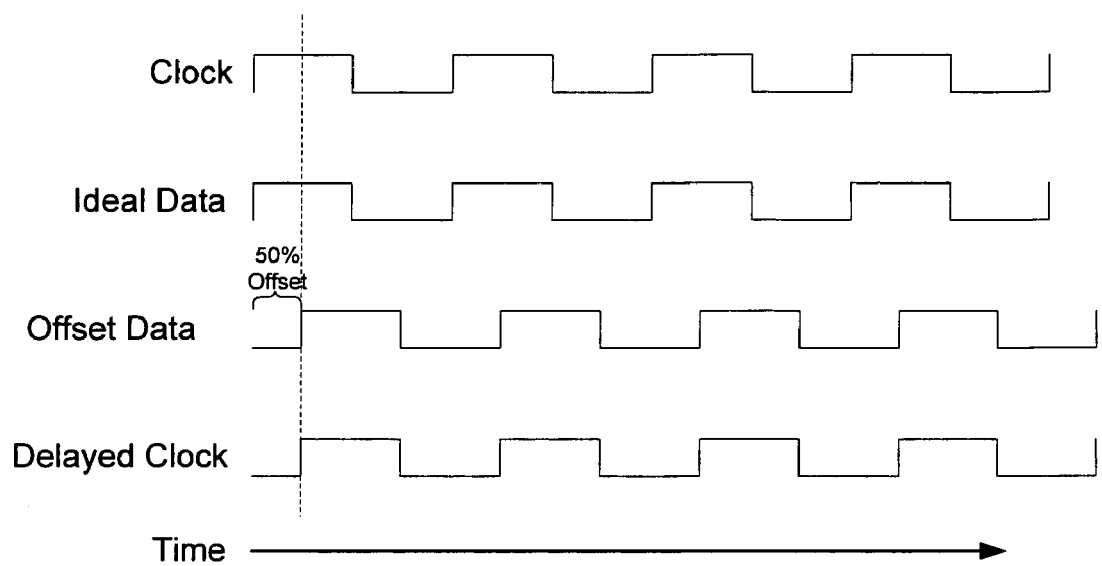
FIG. 1 depicts an embodiment of a timing diagram.

A method has been developed to create a near fixed relationship between clock and data. This involves a delay lock loop (DLL). Although the use of a DLL in solving SDRAM timing requirements is not new, this implementation has two important innovations. The first innovation is the ability to adjust the timing relationship in a programmable manner. The second innovation is the implementation, which is fully digital in nature; there is no analog piece as is typical in DLL implementations.

The programmable timing relationship is specified as a percent offset from ideal. Ideal is when the data changes at the same instant as the rising edge of the clock. The percent offset is called the phase. A 0% phase would represent the ideal case as would 100% phase. A 50% phase would create a clock whose rising edge would occur half way between successive changes in data. By allowing this value to be programmable, the timing relationship between clock and data is both flexible and independent of operating conditions.

The digital implementation uses two matched delay chains, one to measured the number of delay taps in a single clock cycle and the second to delay the clock itself. The number of delay taps in a clock cycle is continually calibrated to account for changes in temperature and voltage during the normal operation of the ASIC. This number is then multiplied by the phase percentage to give target number of delay elements by which to delay the clock. By selecting the proper version of the delayed clock, the timing relationship specified by the phase is achieved.

In a particular embodiment, a delay lock loop is provided for use in meeting timing requirements of a synchronous dynamic random access memory (SDRAM). A timing relationship between data generated by a computer chip and a clock in the SDRAM may be fully programmable. The delay lock loop may be digitally implemented. In a particular embodiment, the timing relationship may be specified as a percent offset from ideal, where the ideal is defined as the data changing at the same instant as the rising edge of the clock. In another particular embodiment, the delay lock loop may include a first delay chain that measures the number of delay taps in a single clock cycle of the clock of the SDRAM and a second delay chain that delays the clock of the SDRAM to match the first delay chain.

In a particular alternative embodiment, a method is provided to meet timing requirements between a clock in a synchronous dynamic random access memory (SDRAM) and data generated by the computer chip. The method includes implementing a delay lock loop where a timing relationship between the clock of the SDRAM and data generated by the computer chip is fully programmable in the delay lock loop and where the delay lock loop is digital. In a particular embodiment, the timing relationship is specified as a percent offset from ideal, where the ideal is the timing relationship where the data changes at the same instant as the rising edge of the clock. In another particular embodiment, the delay lock loop includes a first delay chain to measure a number of delay taps in a single clock cycle of the clock of the SDRAM and a second delay chain that delays the clock of the DRAM to match the first delay chain.

It will be appreciated that still further embodiments of the present invention will be apparent to those skilled in the art in view of the present disclosure. It is to be understood that the present invention is by no means limited to the particular constructions herein disclosed and/or shown in the drawings, but also comprises any modifications or equivalents within the scope of the invention.

What is claimed is:

1. A delay lock loop for use in meeting SDRAM timing requirements, wherein a timing relationship between data generated by a computer chip and a clock in said SDRAM is fully programmable, and wherein said delay lock loop is digitally implemented, wherein said digital implementation comprises:
   a first delay chain to measure a number of delay taps in a single clock cycle of the clock of the SDRAM; and
   a second delay chain to delay the clock of the SDRAM, the second delay chain matched to the first delay chain.

2. The delay lock loop according to claim 1, wherein said programmable timing relationship is specified as a percent offset from ideal, wherein ideal is defined as when said data changes at the same instant as a rising edge of said clock.

3. The delay lock loop of claim 1, wherein the first delay chain is continually calibrated to account for changes in temperature and voltage during operation of a circuit.

4. The delay lock loop of claim 1, wherein the number of delay taps is multiplied by a phase percentage to give a target number of delay elements by which the second delay chain is to delay the clock.

5. A method of meeting timing requirements between a clock in SDRAM and data generated by a computer chip, the method comprising:
  implementing a delay lock loop, wherein:
    a timing relationship between said clock and said data is fully programmable in said delay lock loop; and
    the delay lock loop is digital, wherein the delay lock loop comprises:
      a first delay chain to measure the number of delay taps in a single clock cycle of the clock of the SDRAM; and
      a second delay chain to delay the clock of the SDRAM, the second delay chain matched to the first delay chain.

6. The method according to claim 5, wherein said programmable timing relationship is specified as a percent offset from ideal, wherein ideal is defined as when said data changes at the same instant as a rising edge of said clock.

7. The method of claim 5, further comprising:
  continually calibrating the number of delay taps to account for changes in temperature and voltage during operation.

8. The method of claim 7, further comprising:
  multiplying the number of delay taps by a phase percentage to produce a target number of delay elements; and
  delaying the clock of the SDRAM by the target number of delay elements.

9. The delay lock loop for use in a synchronous dynamic random access memory (SDRAM) device; the delay lock loop comprising:
  a first delay chain to measure a number of delay taps in a single clock cycle of an SDRAM clock; and
  a second delay chain responsive to the first delay chain to delay the SDRAM clock by a target number of delay elements derived from the number of delay taps;
  wherein the delay lock loop is digital; and
  wherein a timing relationship between data generated by a computer chip and a clock signal of the SDRAM clock is fully programmable.

10. The delay lock loop of claim 9, wherein the timing relationship comprises a phase adjustment related to a difference between a data change and an edge of the SDRAM clock.

11. The delay lock loop of claim 10, wherein the edge of the SDRAM clock comprises a rising edge.

12. The delay lock loop of claim 10, wherein the phase adjustment is programmable.

13. The delay lock loop of claim 9, wherein the first delay chain is calibrated continually to account for changes in temperature and voltage during operation.

* * * * *